(12) United States Patent
More et al.

(10) Patent No.: US 11,670,681 B2
(45) Date of Patent: Jun. 6, 2023

(54) METHOD OF FORMING FULLY STRAINED CHANNELS

(71) Applicant: Taiwan Semiconductor Manufacturing Company, Ltd., Hsinchu (TW)

(72) Inventors: Shahaji B. More, Hsinchu (TW); Shu Kuan, Hsinchu (TW); Cheng-Han Lee, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 82 days.

(21) Appl. No.: 17/207,058

(22) Filed: Mar. 19, 2021

(65) Prior Publication Data
US 2022/0223690 A1 Jul. 14, 2022

Related U.S. Application Data

(60) Provisional application No. 63/137,592, filed on Jan. 14, 2021.

(51) Int. Cl.
*H01L 21/306* (2006.01)
*H01L 21/02* (2006.01)
(Continued)

(52) U.S. Cl.
CPC .... *H01L 29/1054* (2013.01); *H01L 21/02532* (2013.01); *H01L 21/308* (2013.01);
(Continued)

(58) Field of Classification Search
CPC ............ H01L 27/0924; H01L 29/1083; H01L 29/66795; H01L 29/7851; H01L 29/78
See application file for complete search history.

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

TW 201735267 A 10/2017

OTHER PUBLICATIONS

Kun-Yu Lin et al.; "FIN Height and STI Depth for Performance Improvement in Semiconductor Devices Having High-Mobility P-Channel Transistors," U.S. Appl. No. 17/158,522, filed Jan. 25, 2021, Assignee: Taiwan Semiconductor Manufacturing Co., Ltd., 27 pages specification, 12 pages drawings.

*Primary Examiner* — Brian Turner
(74) *Attorney, Agent, or Firm* — Haynes and Boone, LLP

(57) ABSTRACT

A method includes forming an N well and a P well in a substrate; depositing a first layer having silicon over the N well and the P well; depositing a first dielectric layer over the first layer; forming a resist pattern over the first dielectric layer, the resist pattern providing an opening directly above the N well; etching the first dielectric layer and the first layer through the opening, leaving a first portion of the first layer over the N well; removing the resist pattern; and epitaxially growing a second layer having silicon germanium (SiGe) over the first portion of the first layer. The epitaxially growing the second layer includes steps of (a) performing a baking process, (b) depositing a silicon seed layer, and (c) depositing a SiGe layer over the silicon seed layer, wherein the steps (a), (b), and (c) are performed under about a same temperature.

20 Claims, 16 Drawing Sheets

(51) Int. Cl.
    *H01L 29/66* (2006.01)
    *H01L 21/311* (2006.01)
    *H01L 21/308* (2006.01)
    *H01L 29/10* (2006.01)
    *H01L 27/092* (2006.01)
    *H01L 29/161* (2006.01)
    *H01L 21/8238* (2006.01)
    *H01L 23/544* (2006.01)

(52) U.S. Cl.
    CPC .. *H01L 21/30604* (2013.01); *H01L 21/30625* (2013.01); *H01L 21/823807* (2013.01); *H01L 21/823821* (2013.01); *H01L 21/823878* (2013.01); *H01L 21/823892* (2013.01); *H01L 23/544* (2013.01); *H01L 27/0924* (2013.01); *H01L 27/0928* (2013.01); *H01L 29/161* (2013.01); *H01L 2223/54426* (2013.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,535,654 B2 | 1/2020 | Tsai et al. |
| 10,535,736 B2 | 1/2020 | More et al. |
| 2015/0115436 A1* | 4/2015 | Han ........................ H01L 24/05 257/737 |
| 2016/0163810 A1 | 6/2016 | Huang et al. |
| 2016/0308048 A1* | 10/2016 | Ching ................. H01L 21/7624 |
| 2017/0221709 A1* | 8/2017 | Ueno ................. C23C 16/4408 |
| 2017/0250183 A1 | 8/2017 | Brunco |
| 2017/0352541 A1* | 12/2017 | Hsu ................. H01L 21/30625 |
| 2018/0025901 A1* | 1/2018 | Park ................. H01L 21/67184 134/61 |
| 2018/0061967 A1* | 3/2018 | Bi ..................... H01L 29/41775 |
| 2019/0093667 A1 | 3/2019 | More et al. |
| 2019/0096997 A1* | 3/2019 | More ................. H01L 27/0924 |
| 2019/0157159 A1 | 5/2019 | Wen et al. |
| 2019/0326290 A1 | 10/2019 | Cea et al. |
| 2019/0341403 A1* | 11/2019 | Wang ................. H01L 27/1211 |
| 2020/0058739 A1 | 2/2020 | Liaw |

* cited by examiner

METHOD OF FORMING FULLY STRAINED CHANNELS

PRIORITY

This application claims the benefits to U.S. Provisional Application Ser. No. 63/137,592 filed Jan. 14, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

FinFET devices have been introduced to increase gate-channel coupling, reduce OFF-state current, and reduce short-channel effects (SCEs) over planar transistors. As the device downscaling continues, traditional FinFET also approaches its performance limitations. For example, aggressively-tight gate dimensions and tiny device volume make doping and strain engineering for performance very challenging for FinFET devices. Improvements for FinFET manufacturing is highly desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
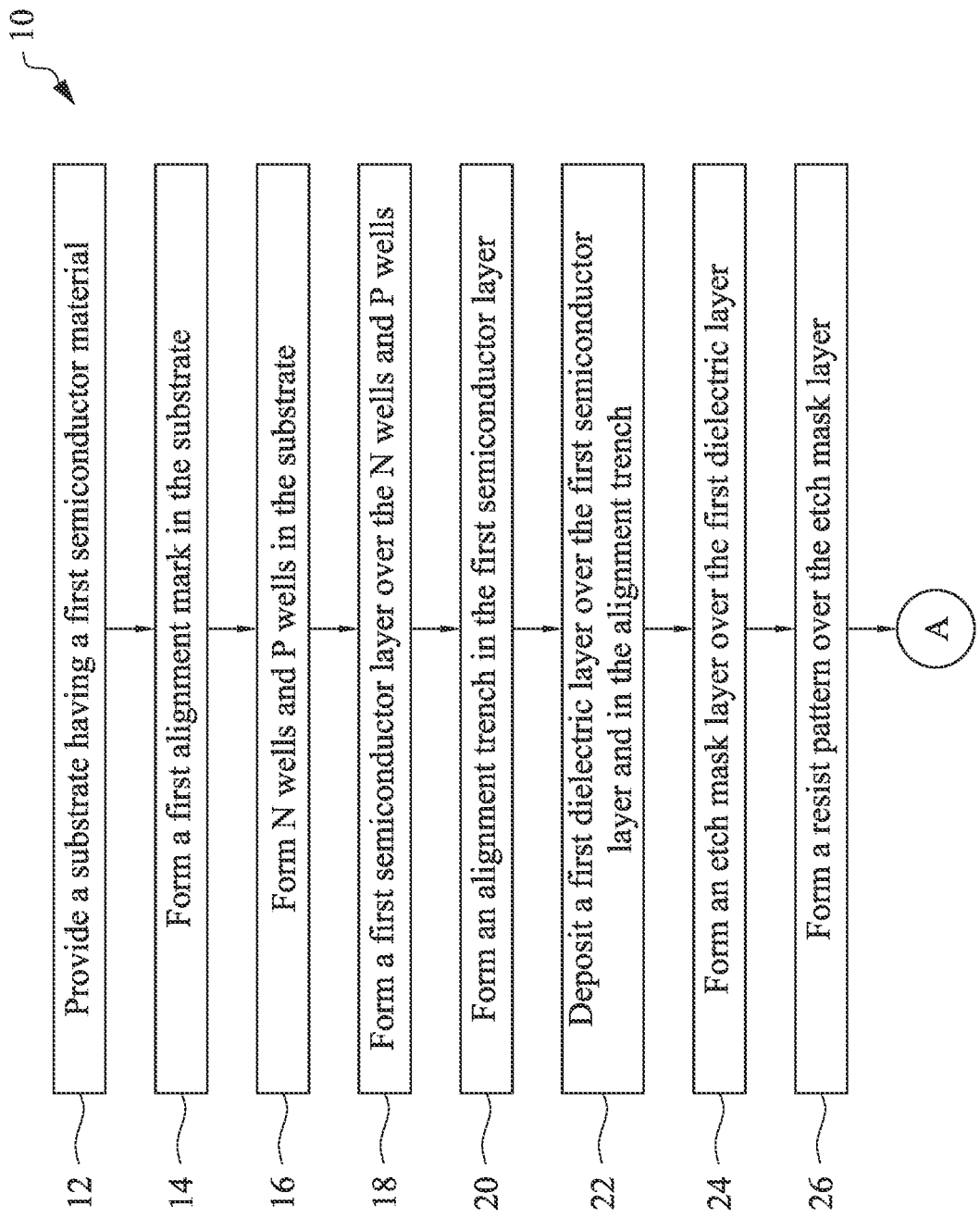
FIGS. 1A, 1B, and 1C show flow charts of a method of forming a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to CMOS (complementary metal-oxide-semiconductor) devices with p-channel FinFET transistors and n-channel FinFET transistors. An object of the present disclosure is to provide methods of forming p-channel fins and n-channel fins on the same substrate where the n-channel fins include a first semiconductor material and the p-channel fins include a second semiconductor material that has a higher charge carrier (e.g., hole) mobility than the first semiconductor material. In an embodiment of the present disclosure, the first semiconductor material is crystalline silicon (Si) and the second semiconductor material is silicon germanium alloy (SiGe). In an embodiment, the p-channel fins are used for forming p-type FinFET and the n-channel fins are used for forming n-type FinFET. Using the p-channel fins further enhances the performance of the p-type FinFET over approaches where both n-type FinFET and p-type FinFET use the same material in their channels.

Embodiments of the present disclosure also improve the epitaxial growth of the semiconductor materials for the p-channel fins by an isothermal process. For example, an embodiment of the present disclosure grows silicon germanium alloy by (a) performing an $H_2$ baking process to a workpiece, (b) depositing a silicon seed layer on the workpiece, and (c) depositing a SiGe layer on the silicon seed layer, wherein the steps (a), (b), and (c) are performed under about the same temperature. In an example, the temperatures under which the steps (a), (b), and (c) are performed may vary by up to +/−10° C. In an embodiment, the steps (a), (b), and (c) are performed under a temperature that is in a range of about 650° C. to 750° C. The isothermal process simplifies the overall process because there is no need to ramp up and down the temperatures for the individual steps (a), (b), and (c), thereby reducing the fabrication time. Further, grown under the isothermal process, the SiGe layer has improved quality and reduced defects across the whole wafer. For example, the SiGe layer has a substantially flat top surface and the thickness of the SiGe layer across a whole wafer is more uniform than it would have been when the H$_2$ baking and the SiGe layer deposition are performed at different temperatures (for example, when the H$_2$ baking is performed at 900° C. to 1000° C. and the SiGe layer deposition is performed at 650° C. to 750° C.). This is particularly beneficial when the wafer provides Si and SiGe fin channels for differently-sized devices such as SRAM (1 or 2 fins, small channel length devices), TCD (three fin devices), and IO (input/output, multi-fins large channel length devices). In other approaches, the thickness of a SiGe layer in differently-sized device regions have a large variation, such as 10 nm to 30 nm variation. With the method of the present disclosure, the thickness variation is reduced to less than 10 nm, such as less 8 nm, across the whole wafer. The uniform thickness improves the performance of subsequent processes such as chemical mechanical planarization (or polishing) (CMP). Those of ordinary skill in the art should appreciate that they may readily use the present disclosure as a basis for designing or modifying other processes and structures for carrying out the same purposes and/or achieving the same advantages of the embodiments introduced herein.

Figure 1B:
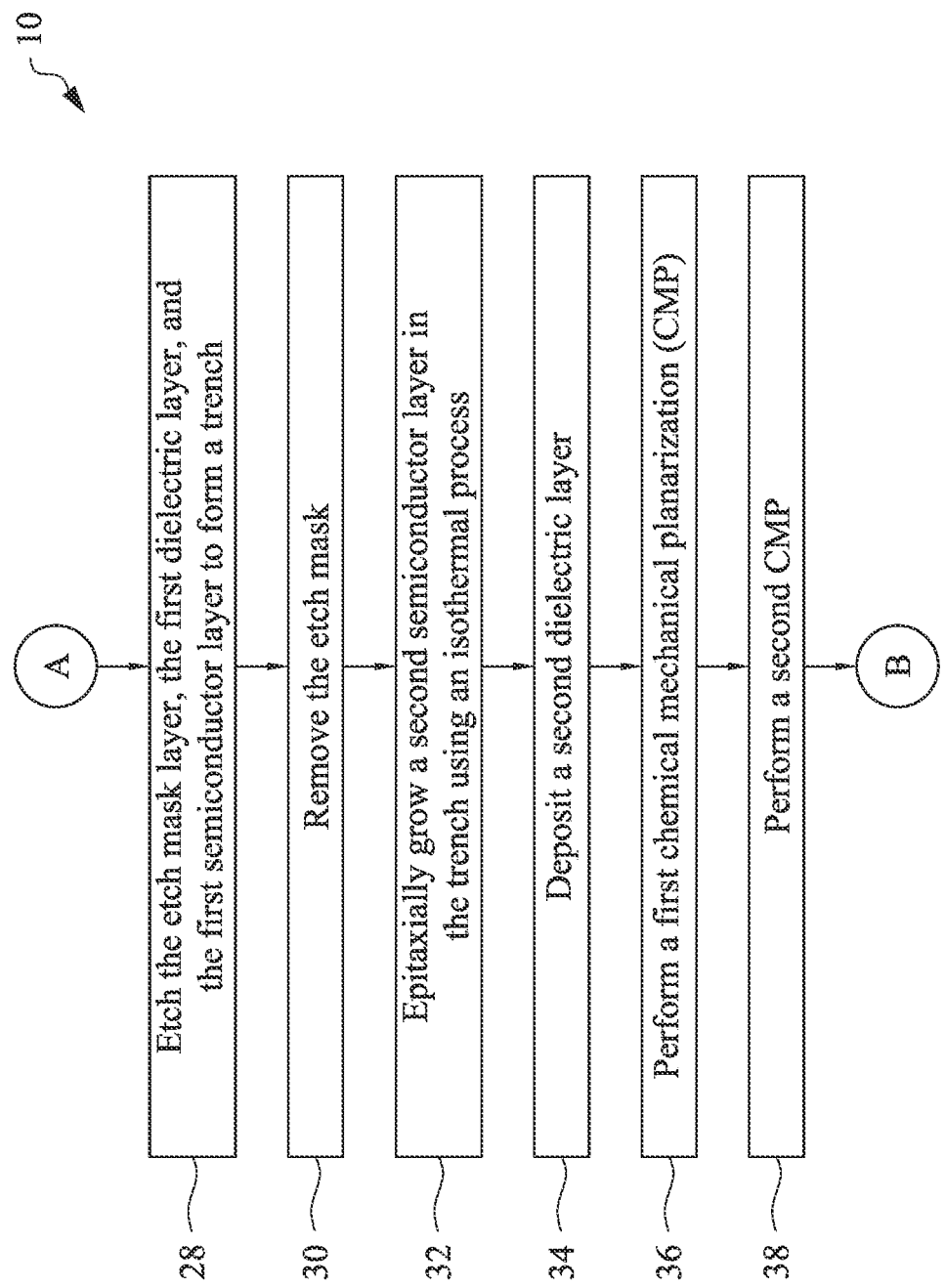
Figure 1C:
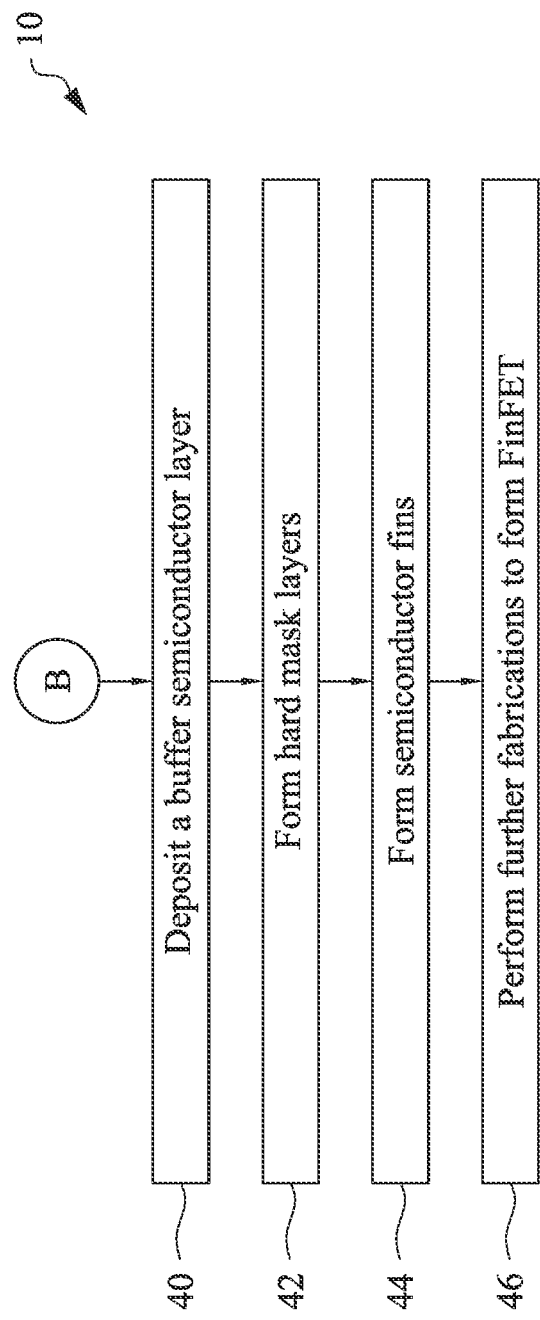

FIGS. 1A, 1B, and 1C are a flow chart of a method 10 for fabricating a semiconductor device (or semiconductor structure) 100 according to various aspects of the present disclosure. Additional processing is contemplated by the present disclosure. Additional operations can be provided before, during, and after method 10, and some of the operations described can be moved, replaced, or eliminated for additional embodiments of method 10.

Method 10 is described below in conjunction with FIG. 2 through FIG. 23 that illustrate various views of the semiconductor device 100 at various steps of fabrication according to the method 10, in accordance with some embodiments. In some embodiments, the device 100 is a portion of an IC chip, a system on chip (SoC), or portion thereof, that includes various passive and active microelectronic devices such as resistors, capacitors, inductors, diodes, p-type field effect transistors (PFETs or pFETs), n-type field effect transistors (NFETs or nFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2 through 23 have been simplified for the sake of clarity to better understand the inventive concepts of the present disclosure. Additional features can be added in the device 100, and some of the features described below can be replaced, modified, or eliminated in other embodiments of the device 100.

Figure 2:
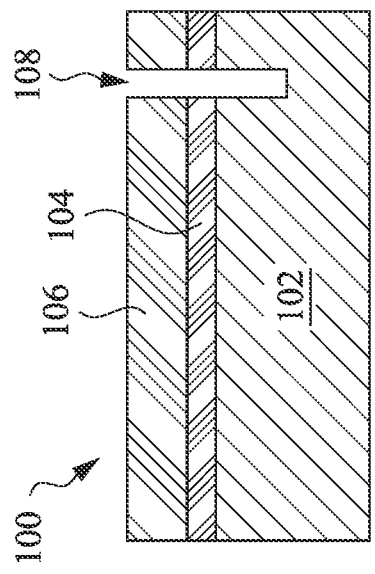
FIGS. 2, 3, 4, 5, 6, 6A, 7, 8, 9, 10, 11, 12, 13, 14, 14A, 14B, 15, 16, 17, 18, 19, 20, and 23 illustrate cross-sectional views of a portion of a semiconductor device, according to some embodiments, in intermediate steps of fabrication according to embodiments of the method of FIGS. 1A-1C.

At operation 12, the method 10 (FIG. 1A) provides or is provided with a substrate 102, such as shown in FIG. 2. In the depicted embodiment, the substrate 102 is a silicon substrate, such as a silicon wafer having crystalline silicon. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

Figure 3:
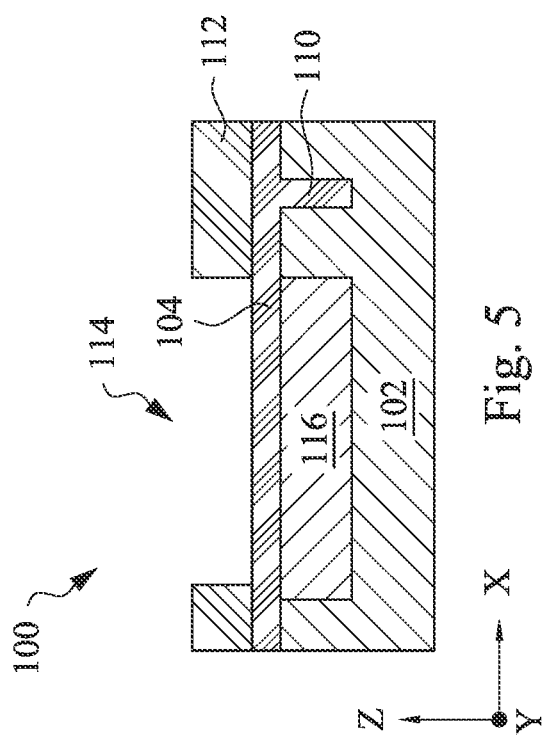
Figure 4:
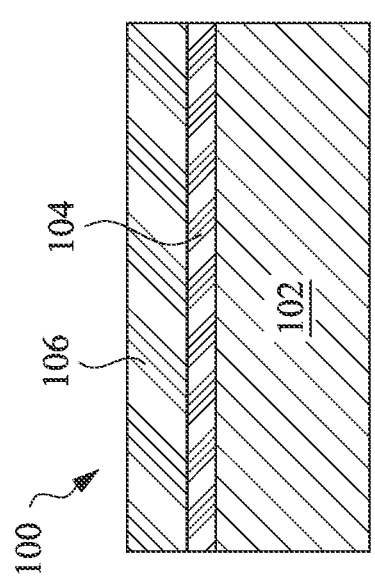
Figure 5:
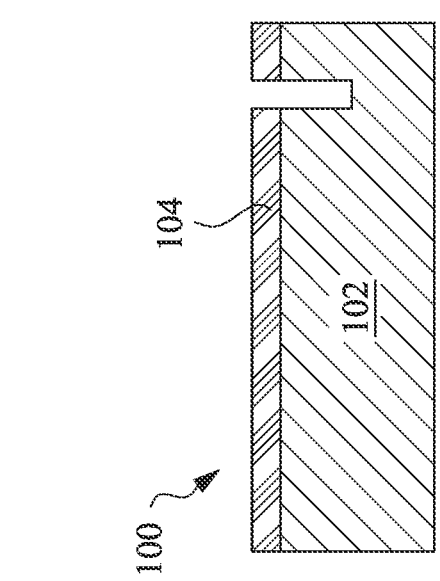

At operation 14, the method 10 (FIG. 1A) forms an alignment mark 110 in the substrate 102 (FIG. 5). This may involve multiple processes, such as illustrated in FIGS. 2-5. As shown in FIG. 2, a dielectric layer 104 is deposited over the substrate 102 and a dielectric layer 106 is deposited over the dielectric layer 104. In an embodiment, the dielectric layer 104 includes an oxide (such as SiO$_2$), and the dielectric layer 106 includes a nitride such as silicon nitride (Si$_3$N$_4$). As shown in FIG. 3, a trench 108 is etched into the dielectric layers 104, 106, and the substrate 102. For example, the method 10 may form a resist pattern using a photolithography process that includes forming a resist layer over the device 100 (e.g., by spin coating), performing a pre-exposure baking process, performing an exposure process using a photomask, performing a post-exposure baking process, and developing the exposed resist layer in a developer solution. Alternatively, the exposure process can be implemented or replaced by other methods, such as maskless lithography, e-beam writing, ion-beam writing, or combinations thereof. After development, the resist layer becomes a resist pattern that provides an opening corresponding to the trench 108. Then, the dielectric layers 104, 106, and the substrate 102 are etched through the resist pattern to form the trench 108. Thereafter, the resist pattern is removed, for example, using resist stripping. As shown in FIG. 4, the dielectric layer 106 is removed, for example, using an etching process that is selective to the material of the dielectric layer 106. As shown in FIG. 5, a dielectric layer 110 is filled into the trench 108 and becomes an alignment mark 110. In an embodiment, the dielectric layer 110 includes an oxide and may be the same as or substantially the same as the material in the dielectric layer 104.

Figure 6A:
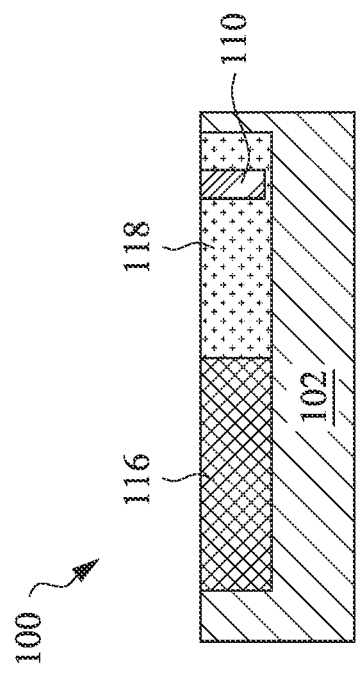
Figure 6:
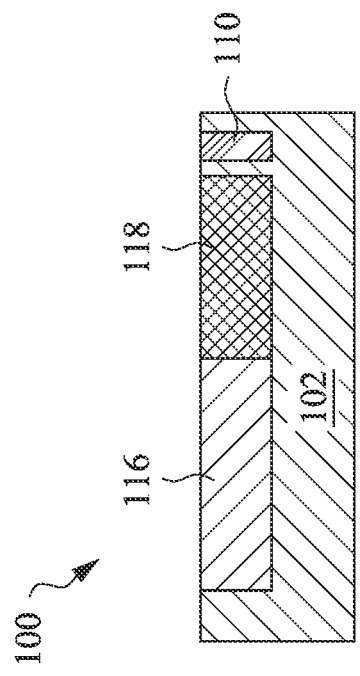

At operation 16, the method 10 (FIG. 1A) forms N wells 116 and P wells 118 into the substrate 102 (FIG. 6). This may involve multiple processes. For example, the method 10 may form an implant mask 112 over the dielectric layer 104 and the alignment mark 110, such as shown in FIG. 5. The implant mask 112 provides an opening 114 that corresponds to an area of the substrate 102 where an N well is to be formed. The implant mask 112 may be a resist pattern formed using a photolithography process as discussed above. In an embodiment, the alignment mark 110 is used to determine where the opening 114 is formed during the photolithography process. For example, the opening 114 is formed at certain distance away from the alignment mark 110. Then, ion implantation may be used to form an n-type region (or N well) 116 in the substrate 102. In some embodiments, the N well 116 is substantially aligned to the opening 114. According to some embodiments, the n-type dopant may include arsenic (As), antimony (Sb), or phosphorous (P). According to some embodiments, the n-type dopant concentration in the N well 116 can range from about 5E16 atoms/cm$^3$ to about 1E19 atoms/cm$^3$. By way of example and not limitation, the N well 116 can have a depth (e.g., z-direction) of about 100 nm to about 500 nm. However, the width (e.g., along the x-direction) and length (e.g., along the y-direction, into the page of FIG. 5) can vary depending on the device (e.g., logic, static random access memory (SRAM), etc.). After the formation of the N well 116, the implant mask 112 can be removed.

In an embodiment, a similar process that involves patterning a photoresist layer as an implant mask can be used to form a p-type region (P well) 118 in the substrate 102, which is adjacent to the N well 116, as shown in FIG. 6. In some embodiments, the P well 118 can be created with an ion implantation process using a p-type dopant such as boron (B). By way of example and not limitation, the P well 118 can have a dopant concentration that ranges from about 5E16 atoms/cm$^3$ to about 1E19 atoms/cm$^3$. In some embodiments, an annealing step is performed to activate the dopants (e.g., move the dopants from interstitial sites to silicon lattice sites) in the N well 116 and the P well 118 and repair any silicon crystal damage which occurred during the ion implantation step. According to some embodiments, the dielectric layer 104 is removed after the dopant activation anneal, but the alignment mark 110 remains in the substrate 102. For example, the dielectric layer 104 may be removed by chemical mechanical planarization (CMP) and/or etching processes.

In some embodiment, the P well 118 is formed at a distance away from the alignment mark 110, such as shown in FIG. 6. In some embodiment, the P well 118 is formed such that the alignment mark 110 is within the P well 118, such as shown in FIG. 6A. In the following discussion of the method 10, the embodiment depicted in FIG. 6 is used as an example. However, the same discussion can be applied to the embodiment depicted in FIG. 6A.

Figure 7:
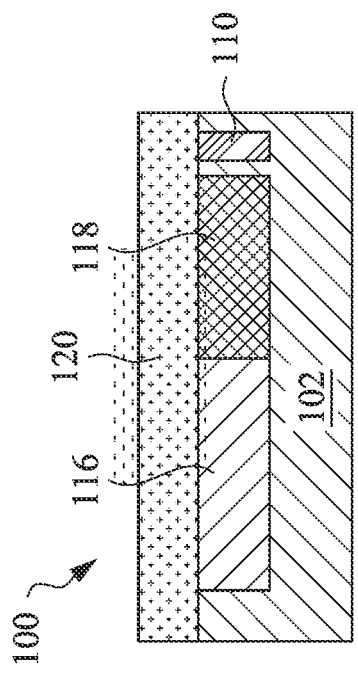

At operation 18, the method 10 (FIG. 1A) forms a semiconductor layer 120 over the N well 116, the P well 118, and the alignment mark 110, such as shown in FIG. 7. For example, a layer of silicon can be epitaxially grown directly on the substrate 102 as the semiconductor layer 120. For example, silicon can be epitaxially grown with a chemical vapor deposition (CVD) process using precursors such as silane (SiH$_4$), silicon tetrachloride (SiCl$_4$), trichlorosilane (TCS), or dichlorosilane (SiH$_2$Cl$_2$ or DCS). In some embodiments, the semiconductor layer 120 can have a thickness in a range between about 30 nm to about 100 nm.

Figure 8:
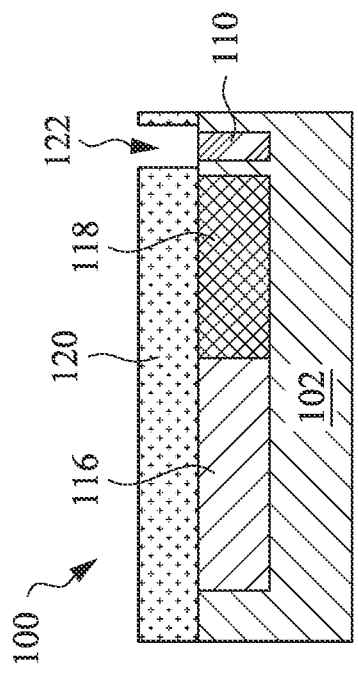

At operation 20, the method 10 (FIG. 1A) forms an alignment trench 122 in the semiconductor layer 120. In an embodiment, the alignment trench 122 is formed overlapping with (for example, directly above) the alignment mark 110, such as shown in FIG. 8. Alternatively, the alignment trench 122 may be formed non-overlapping with the alignment mark 110. As will be discussed, another alignment mark will be formed in the alignment trench 122. The alignment trench 122 and the alignment mark therein can assist with the fabrication of fully strained channels in the semiconductor layer 120. The alignment trench 122 may be formed using the same or similar way as the way the alignment trench 108 is formed, as discussed above (i.e., using photolithography and etching processes).

Figure 9:
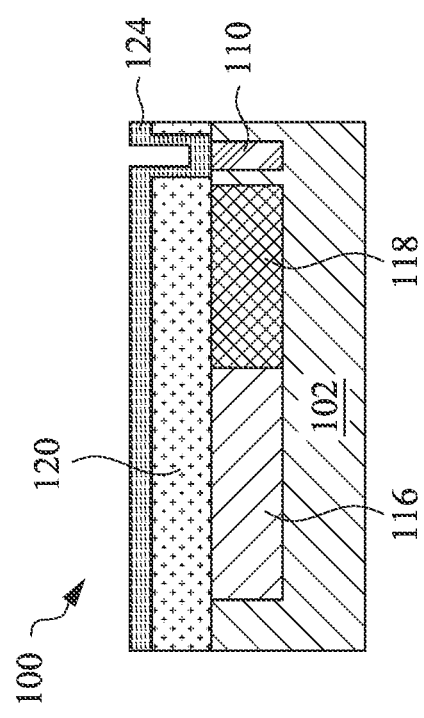

At operation 22, the method 10 (FIG. 1A) deposits a dielectric layer 124 over the semiconductor layer 120 and in the alignment trench 122, such as shown in FIG. 9. For example, the dielectric layer 124 may include an oxide, such as silicon dioxide (SiO$_2$). In the embodiment depicted in FIG. 9, the dielectric layer 124 is deposited over the sidewall and the bottom surface of the alignment trench 122 but does not fully fill the alignment trench 122. In an alternative embodiment, the dielectric layer 124 fully fills the alignment trench 122.

Figure 10:
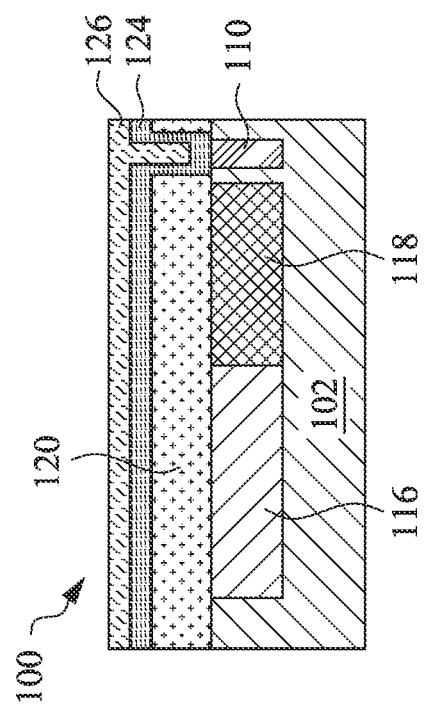

At operation 24, the method 10 (FIG. 1A) forms an etch mask layer 126 over the dielectric layer 124. In an embodiment where the dielectric layer 124 partially fills the alignment trench 122, the etch mask layer 126 fills into the remaining portion of the alignment trench 122, such as shown in FIG. 10. In an alternative embodiment where the dielectric layer 124 fully fills the alignment trench 122, the etch mask layer 126 does not fill into the alignment trench 122 (not shown). The etch mask layer 126 may include a bottom anti-reflective coating (BARC) material in an embodiment.

Figure 11:
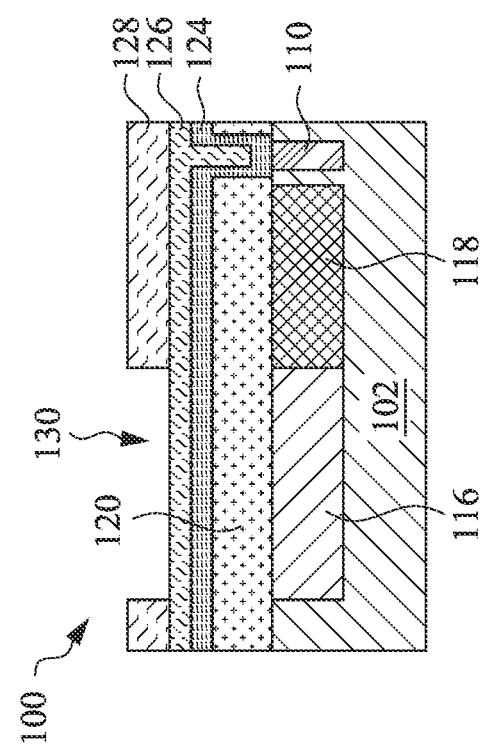

At operation 26, the method 10 (FIG. 1A) forms a resist pattern 128 over the etch mask layer 126, such as shown in FIG. 11. The resist pattern 128 provides an opening 130 that exposes an area of the etch mask layer 126 directly above the N well 116. In an embodiment, the opening 130 is aligned with the N well 116 by using the alignment mark 110 and the alignment trench 122 (and the dielectric layers 124 therein). The resist pattern 128 may be formed using a photolithography process that includes spin coating a resist layer over the device 100, baking the resist layer, exposing the resist layer using a photomask, performing post-exposure baking, and developing the exposed resist layer in a developer solution. Alternatively, the exposure process can be implemented or replaced by other methods, such as maskless lithography, e-beam writing, ion-beam writing, or combinations thereof. After development, the resist layer becomes the resist pattern 128.

Figure 12:
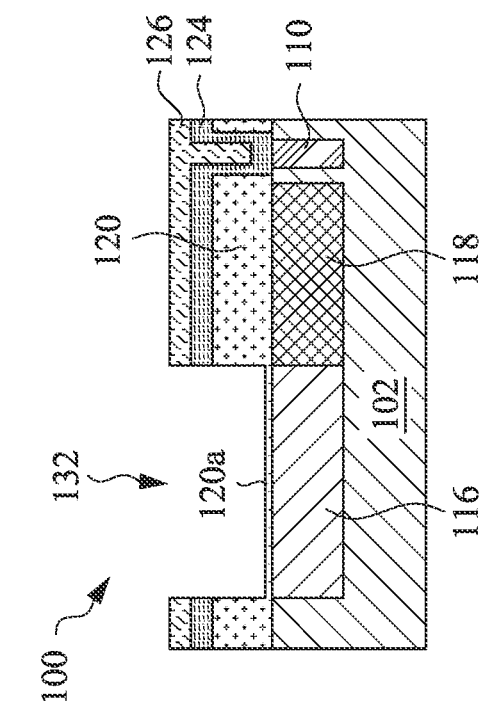

At operation 28, the method 10 (FIG. 1B) etches the etch mask layer 126, the dielectric layer 124, and the semiconductor layer 120 through the opening 130 to form a trench 132 in the semiconductor layer 120. The operation 28 may use one or more dry etching processes to etch the etch mask layer 126, the dielectric layer 124, and the semiconductor layer 120 such that the shape of the trench 132 substantially matches the opening 130. In an embodiment, the semiconductor layer 120 is partially etched, leaving a thin portion 120a of the semiconductor layer 120 at the bottom of the trench 132, such as shown in FIG. 12. This can be achieved by timing the dry etching processes. In an alternative embodiment, the semiconductor layer 120 is fully etched, thereby exposing the N well 116 in the trench 132 (not shown). In the embodiment depicted in FIG. 12, the portion 120a may have a thickness in a range about 0 nm to about 10 nm, such as from about 1 nm to about 5 nm. After the etching processes finish, the resist pattern 128 is removed, for example, using resist stripping, wet cleaning, or other suitable method.

Figure 13:
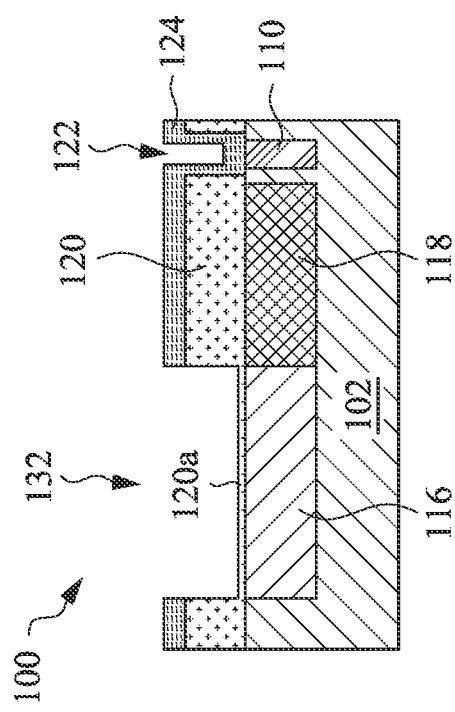

At operation 30, the method 10 (FIG. 1B) removes the etch mask layer 126, for example, using cleaning, etching, or other suitable methods. In embodiments where the etch mask layer 126 partially fills the trench 122, the etch mask layer 126 is also removed from the trench 122, such as shown in FIG. 13. After the etch mask layer 126 is removed, the dielectric layer 124 still covers the semiconductor layer 120 except the surfaces of the semiconductor layer 120 exposed in the trench 132. Then, the operation 30 may perform a cleaning process to the surfaces of the semiconductor layer 120 exposed in the trench 132. For example, a cleaning process may apply plasma etching using a mixture of nitrogen trifluoride (NF$_3$) and ammonia (NH$_3$) gases. The plasma etching may also include inert gases such as argon (Ar), helium (He), hydrogen (H$_2$), nitrogen (N$_2$), or a combination thereof. The cleaning process may further include an anneal process. For example, the anneal process can be performed from about 30° C. to about 200° C. such as from about 60° C. to about 200° C. The cleaning process cleans the surfaces of the semiconductor layer 120 and make them ready for the subsequent epitaxial growth.

Figure 14:
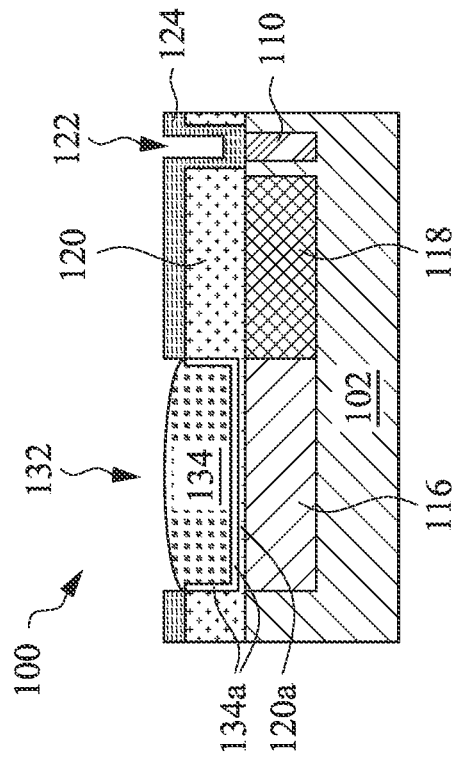

At operation 32, the method 10 (FIG. 1B) epitaxially grows a semiconductor layer 134 in the trench 132, such as shown in FIG. 14. In an embodiment, the semiconductor layer 134 has a material that has a higher charge carrier (e.g., hole) mobility than the material of the semiconductor layer 120. For example, the semiconductor layer 134 includes silicon germanium and the semiconductor layer 120 includes silicon. The semiconductor layer 134 provides strained channel material for p-type FinFETs. The semiconductor layer 134 is not grown on the surfaces of the dielectric layer 124. In the present embodiment, the operation 32 includes three steps (or sub-operations): a baking step, a seed layer deposition step, and a main epitaxial growth step that forms an epitaxial layer on the seed layer. Further, the operation 32 is an isothermal operation. In other words, the operation 32 performs the three sub-operations at about the same temperature, taking into account any temperature variations caused by heating equipment or process chambers. For example, the temperature (recipe temperature) for the three sub-operations may be set to the same value in a process recipe but the temperatures (actual temperatures) under which the three sub-operations are actually performed may vary depending on the equipment used. In some embodiments, the actual temperatures may vary by up to +/−10° C. throughout the three sub-operations. In some embodiments, the actual temperatures may vary by up to +/−5° C. throughout the three sub-operations. In some embodiments, the actual temperatures may vary by up to +/−2% of the recipe temperature throughout the three sub-operations. All these are considered to be within the meaning of the isothermal process of the present disclosure. In a further embodiment, the operation 32 is an isobaric process. In other words, the operation 32 performs the three sub-operations at about the same pressure, taking into account any pressure variations caused by process chambers. For example, the operation 32 may performs the three sub-operations at pressure of nominal 10 torr or another suitable pressure. In the present embodiment, the operation 32 epitaxially grows a silicon germanium layer 134 over a silicon seed layer 134a. To further this embodiment, the three sub-operations (baking, Si seed layer deposition, and SiGe epitaxial growth) are performed at a temperature (recipe temperature) in a range from about 650° C. to about 750° C.

The benefits of using an isothermal process in the operation 32 are many folds. For example, the operation 32 is more efficient than some approaches where different temperatures are used for different steps. Because the temperature is the same throughout the operation 32, there is no need to ramp up and ramp down the temperatures in the process chamber(s), thereby reducing fabrication time. For example, if the baking step uses a higher temperature than the seed layer deposition step or the epitaxial growth step, then a cooling period would have to be included after the baking step, which would undesirably prolong the fabrication. Another benefit is that using an isothermal process improves the quality of the semiconductor layer 134. This is further discussed with reference to FIG. 14B which illustrates an enlarged cross-sectional view of the device 100.

Referring to FIG. 14, in the present embodiment, the semiconductor layer 134 is grown such that its top surface is higher than the topmost surface of the semiconductor layer 120 but even with or lower than the topmost surface of the dielectric layer 124. Due to the isothermal process, the top surface of the semiconductor layer 134 is substantially flat. In some experiments, the top surface of the semiconductor layer 134 may vary about 10 nm or less, such as 8 nm or less or 5 nm or less, in different areas of a wafer, and in some cases the variation is only about 1 nm to about 2 nm across a whole wafer. In other words, the top surface of the semiconductor layer 134 may have a very high uniformity across a whole wafer in some embodiments. For example, the semiconductor layer 134 at different device regions on the same wafer (such as device regions for smaller transistors such as SRAM regions and device regions for larger transistors such as I/O regions or TCD regions) has a substantially uniform and coplanar top surface. This greatly reduces the difficulties in subsequent chemical mechanical planarization (CMP) processes, which will be discussed later. This also reduces the time for the CMP processes because there is less amount of material to be polished than approaches where the non-uniformity of the top surface of the semiconductor layer 134 is larger.

Figure 14A:
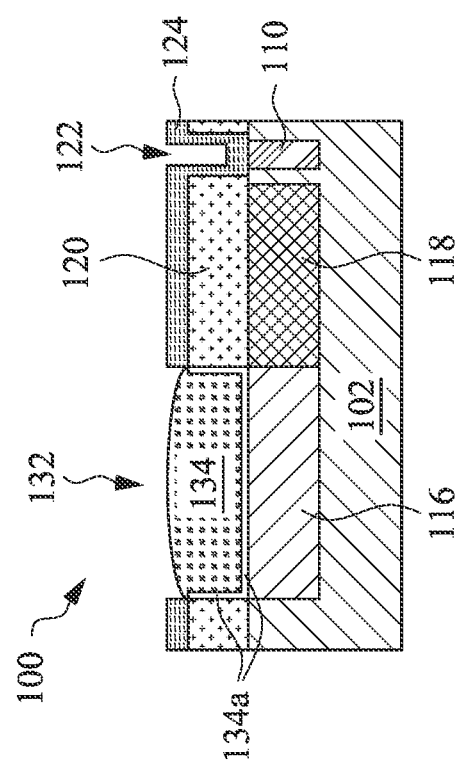
Figure 14B:
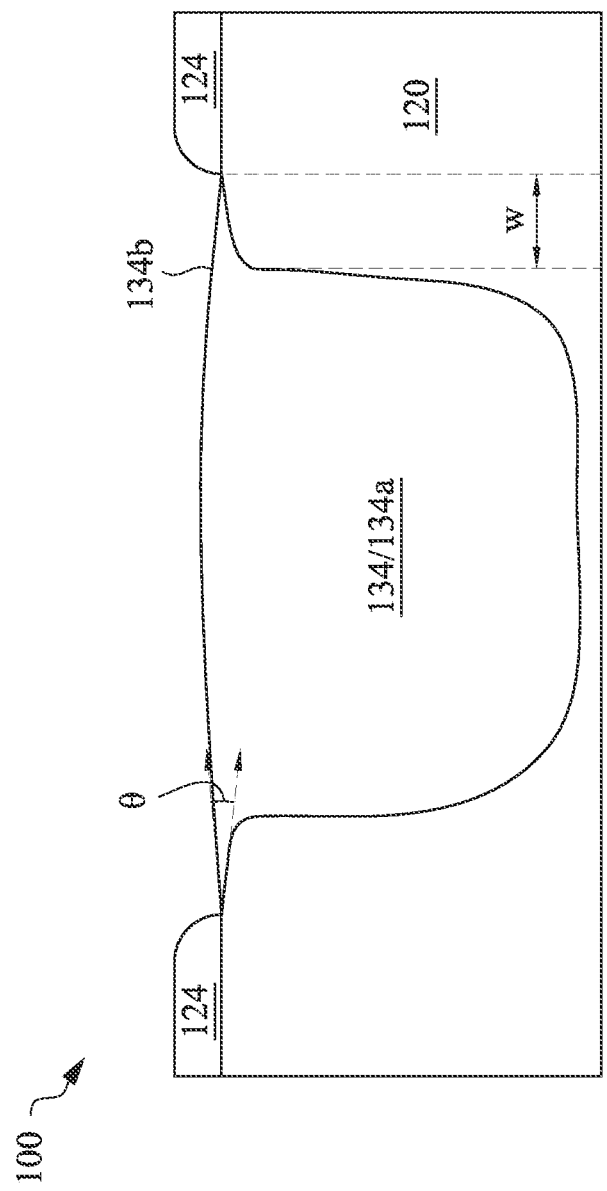

In some embodiments, the edges of the dielectric layer 124 do not perfectly align with the trench 132 when the semiconductor layer 134 is grown. For example, this may occur during the process of cleaning the trench 132 where the cleaning plasma (such as $NF_3$ and $NH_3$) slightly etches the dielectric layer 124 (such as containing silicon dioxide). Thus, the top corners of the dielectric layer 124 may become rounded and the edges of the dielectric layer 124 may retreat from the edges of the trench 132, such as shown in FIG. 14B. In such embodiments, the semiconductor layer 134 may extend laterally over the semiconductor layer 120 by a width W. This portion of the semiconductor layer 134 is referred to as the extension portion 134b. In some embodiments, the width W is in a range from about 5 nm to about 20 nm. The slope θ of the top surface of the extension portion 134b (which is the angle between the top surface of the extension portion 134b and the top surface of the semiconductor layer 120) is in a range of 30 degrees or less, such as in a range of about 5 degrees to about 20 degrees in some embodiments. The slope θ is smaller than other approaches which do not use the disclosed isothermal process.

In an embodiment, the baking step of the operation 32 is performed in $H_2$ ambient at a pressure about 10 torr to about 600 torr and for about 30 seconds to about 120 seconds. Baking in $H_2$ ambient controls reflow of the semiconductor layer 120, reduces the surface roughness of the surfaces of the trench 132, and removes oxide residue on the surfaces of the trench 132, thereby improving the quality of subsequently deposited seed layer and epitaxial layer. In alternative embodiments, other gases may be additionally or alternatively used, such as argon (Ar), nitrogen ($N_2$), helium (He), or a combination thereof. The baking step is performed at a temperature in a range from about 650° C. to about 750° C., which is the same temperature as the seed layer deposition and the epitaxial growth steps. This temperature is noticeably lower than other approaches. For example, some approaches may perform a baking process at a temperature ranging from 900° C. to 1000° C. and then perform the subsequent processes at a lower temperature (such as more than 20% lower). The lower thermal budget of the baking step as well as the isothermal process in the present disclosure result in the trench 132 having a better profile for epitaxial growth and contributes to the uniformity of the top surface of the semiconductor layer 134, whose benefits have been discussed above.

In an embodiment, the seed layer deposition step of the operation 32 may be performed at a pressure about 5 torr to about 50 torr, and the seed layer 134a may be deposited to about 2 nm to about 10 nm thick on the surfaces of the trench 132. In embodiments where the semiconductor layer 120 is partially etched when forming the trench 132, the seed layer 134a is deposited on the surfaces of the semiconductor layer 120 exposed in the bottom and sidewalls of the trench 132, such as shown in FIG. 14. In embodiments where the semiconductor layer 120 is fully etched when forming the trench 132, the seed layer 134a is deposited on the surface of the semiconductor layer 116 on the bottom of the trench 132 and on the surfaces of the semiconductor layer 120 exposed in the sidewalls of the trench 132, such as shown in FIG. 14A. In some embodiments, the seed layer 134a may be deposited for about 3 seconds to about 10 seconds depending on the seed layer deposition rate and the desired seed layer thickness. The seed layer 134a can be used to control the corner rounding of the semiconductor layer 134. In some embodiments, the seed layer 134a may be a Si layer, a Si:C layer, a SiGe layer, or a combination thereof. For example, the seed layer 134a can be Si/Si:C/SiGe, Si/SiGe, or Si:C/SiGe in some embodiments. According so some embodiments, the atomic percentage (at. %) of carbon dopant in Si:C can be from about 0.01 at. % to about 2 at. %. The seed layer 134a can be deposited by CVD or other suitable methods (such as ALD). For example, a Si seed layer 134a can be deposited using precursor gases $SiH_4$ and/or DCS and carrier gases $H_2$ or $N_2$. For another example, a SiGe seed layer 134a can be deposited using precursor gases $SiH_4$, disilane ($Si_2H_6$), germane ($GeH_4$), and hydrochloric acid (HCl) and carrier gases $H_2$, $N_2$, He or Ar.

In the main epitaxial growth step of the operation 32, an epitaxial layer 134 is formed on the seed layer 134a to fill the trench 132. In an embodiment, the epitaxial layer 134 includes SiGe and can be grown using precursor gases such as $SiH_4$, $Si_2H_6$, $SiH_2Cl_2$, $GeH_4$, and/or HCl with a carrier gas such as $H_2$, $N_2$, Ar, or a combination thereof. Epitaxially growing SiGe can be performed at a pressure about 5 torr to about 50 torr. The epitaxial growth may be performed for about 80 seconds to about 200 seconds depending on the epitaxial growth rate and the depth of the trench 132. In an embodiment, growth of the epitaxial layer 134 is controlled (e.g., timed) such that the top surface of the epitaxial layer 134 is above the top surface of the semiconductor layer 120 but even with or below the top surface of the dielectric layer 124. In some embodiments, the Ge concentration in atomic percentage (at. %) is constant throughout the thickness (e.g., along the z-direction) of the SiGe epitaxial layer 134 and can range from about 20 at. % to about 40 at. %. In some embodiments, the SiGe epitaxial layer 134 may include a first sub-layer that has a Ge concentration up to about 5 at. %, and a second sub-layer with a constant Ge concentration throughout the thickness of the SiGe epitaxial layer ranging from about 20 at. % to about 40 at. %.

Figure 15:
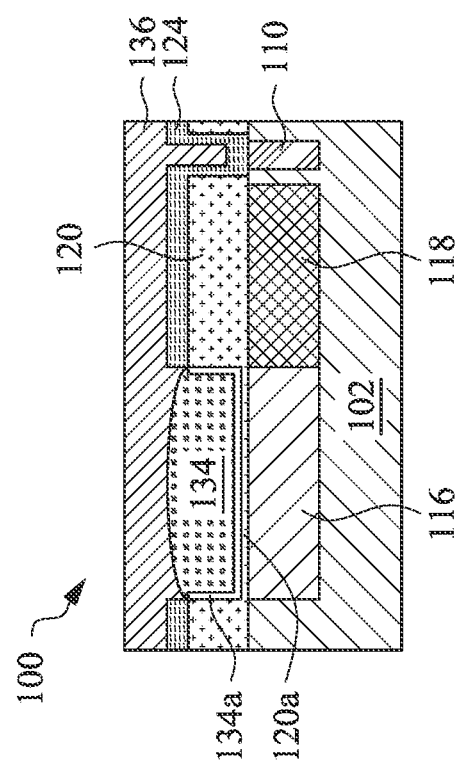

At operation 34, the method 10 (FIG. 1B) deposits another dielectric layer 136 over the dielectric layer 124 and the semiconductor layer 134, such as shown in FIG. 15. In an embodiment, the dielectric layer 136 includes an oxide such as silicon dioxide. In an embodiment, both dielectric layers 124 and 136 include oxide such as silicon dioxide. Having the dielectric layer 136 assists in removing the dielectric layer 124 by a CMP process. Otherwise, since the dielectric layer 124 is relatively thin (for example, it may be about 10 nm to about 15 nm thick in some embodiments), it may not be easily removed by a CMP process without damaging the semiconductor layers 120 and 134. The dielectric layer 136 may be deposited using CVD or other suitable processes. The dielectric layer 136 may be deposited to a thickness in a range from about 5 nm to about 20 nm in some embodiments. In the embodiment depicted in FIG. 15, since the dielectric layer 124 does not fully fill the trench 122, the dielectric layer 136 is deposited to fill the remaining portion of the trench 122.

Figure 16:
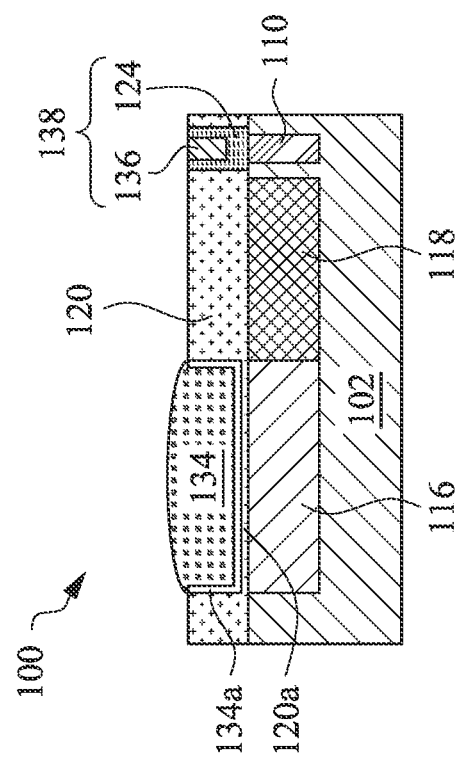

At operation 36, the method 10 (FIG. 1B) performs a CMP process to remove the dielectric layers 136 and 124 from the device 100, such as shown in FIG. 16. In an embodiment, the CMP process is designed selective to the materials of the dielectric layers 136 and 124. For example, the CMP process may use a slurry that is selective to the materials of the dielectric layers 136 and 124 but not to the materials of the semiconductor layers 134 and 120. In the present embodiment, because the top surface of the semiconductor layer 134 is substantially flat and does not protrude above the dielectric layer 124, the dielectric layers 136 and 124 can be removed by the CMP process completely from the surface of the semiconductor layer 120 with no dielectric residue on the surface of the semiconductor layer 120. In some embodiments, the CMP process may leave negligible dielectric residue on the surface of the semiconductor layer 120. As discussed above, in approaches that do not use the isothermal process of the present disclosure, the top surface of the semiconductor layer 134 may protrude above the dielectric layer 124 and may have a relatively large non-uniformity in different device regions of a wafer. Consequently, there may be a large amount of dielectric residue (such as 1 nm or 2 nm thick) on some areas of the top surface of the semiconductor layers 134 and 120 after a CMP process has been performed to remove the dielectric layers 136 and 124. Such large amount of dielectric residue may cause defects or defective devices in subsequent fabrication process. In contrast, in the present disclosure, the dielectric layers 136 and 124 can be completely removed from the top surfaces of the semiconductor layers 134 and 120, and any dielectric residue on the top surfaces of the semiconductor layers 134 and 120 is negligible (for example, dielectric residue, if any, is less than about 0.5 nm to about 0.9 nm in some cases). As depicted in FIG. 16, portions of the dielectric layers 136 and 124 remain in the trench 122 after the CMP process, thereby forming a dielectric alignment mark 138 in the semiconductor layer 120. In some embodiments, when the dielectric layer 124 fully fills the trench 122 in the operation 22, the alignment mark 138 includes only the dielectric layer 124 and not the dielectric layer 136. This alignment mark 138 can be used to align the fins made from the semiconductor layers 134 and 120. In the present embodiment, the alignment marks 138 and 110 may be considered different portions of a large alignment mark.

Figure 17A:
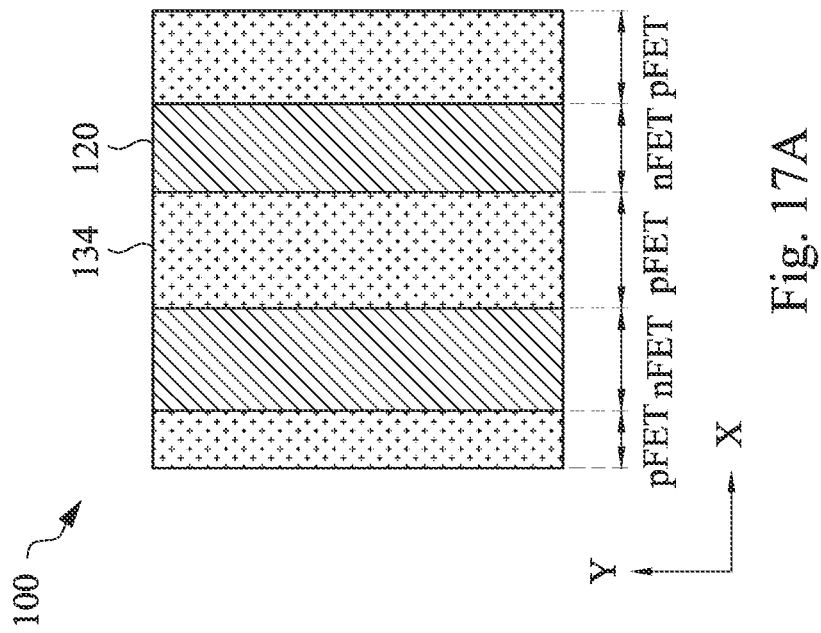
FIG. 17A illustrates a top view of a portion of a semiconductor device, according to some embodiments.
Figure 17:
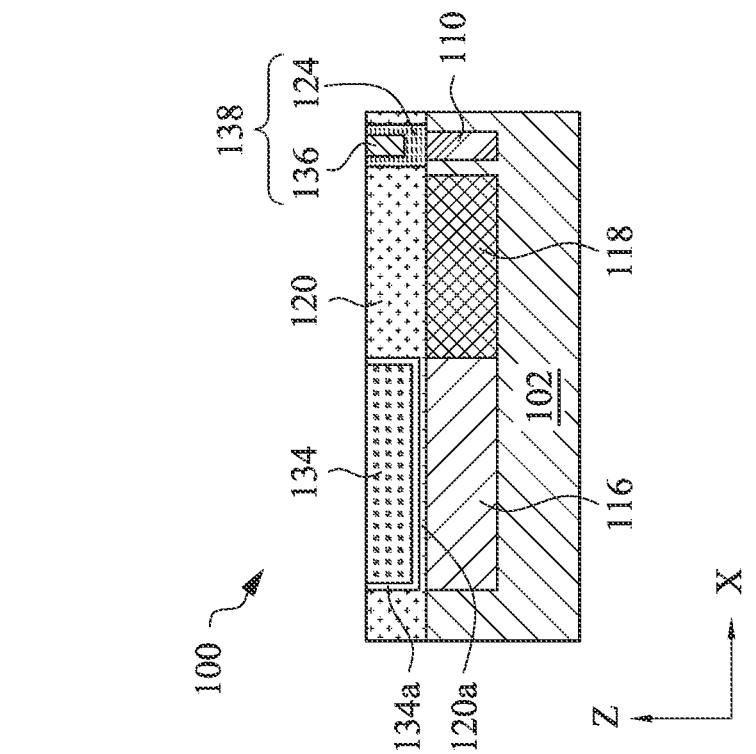

At operation 38, the method 10 (FIG. 1B) performs another CMP process to the semiconductor layers 134 and 120 and the alignment mark 138. In an embodiment, the CMP process is designed to be non-selective to the materials of the alignment mark 138 and the semiconductor layers 134 and 120. In other words, the CMP process polishes the semiconductor layers 134 and 120 and the alignment mark 138 at about the same rate. As shown in FIG. 17, after the CMP process finishes, the top surfaces of the semiconductor layers 134 and 120 and the alignment mark 138 are coplanar or substantially coplanar (up to the capability of the CMP process). In the present embodiment, because there is little to no dielectric residue on the semiconductor layers 134 and 120, an extra etching for removing such dielectric residue is not needed. In some approaches where an etching process is applied after the CMP process to remove dielectric residue from the top surface of the semiconductor layer 120, the alignment mark 138 would be recessed and its top surface would be lower than the top surface of the semiconductor layers 120 and 134, unlike the present embodiment. When the alignment mark 138 is too low, it may not serve well as an alignment mark during subsequent photolithography processes. Because the top surfaces of the semiconductor layers 134 and 120 and the alignment mark 138 are coplanar or substantially coplanar, the alignment mark 138 is easily recognizable by metrology tools and serves well as an alignment mark during subsequent photolithography processes. In an embodiment, the CMP process may remove about 5 nm to about 15 nm of the respective materials along the "Z" direction. FIG. 17A illustrates a portion of the device 100 at this fabrication stage from a top view. Referring to FIG. 17A, the device 100 includes various pFET and nFET regions that are alternatively arranged along the "X" direction, which is the widthwise direction of fins to be fabricated later. The semiconductor layer 134 is provided in each of the pFET regions and the semiconductor layer 120 is provided in each of the nFET regions. The semiconductor layers 134 and 120 are oriented lengthwise along the "Y" direction, which is the lengthwise direction of fins to be fabricated later. The semiconductor layer 134 includes SiGe and the semiconductor layer 120 includes Si in this embodiment. In an embodiment, the semiconductor layer 120 in each of the nFET regions may be replaced with another semiconductor material using a method that is similar to the method of forming the semiconductor layer 134.

Figure 18:
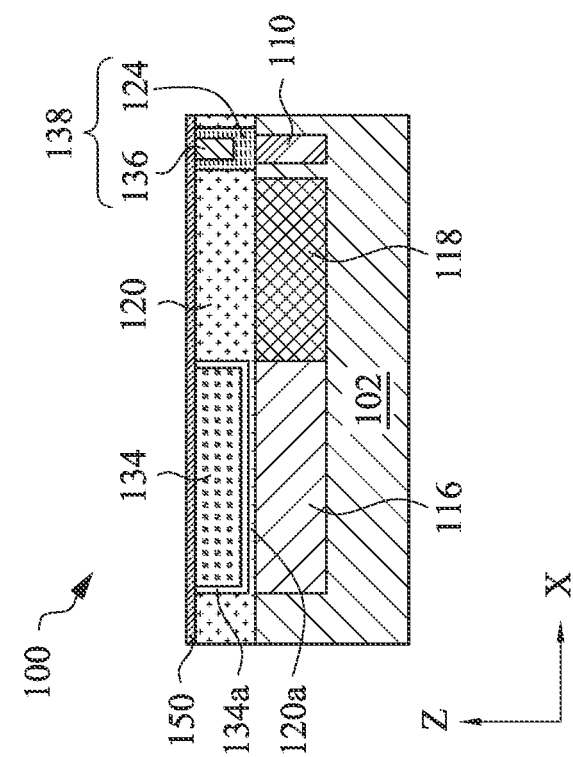

At operation 40, the method 10 (FIG. 1C) deposits a buffer semiconductor layer 150 over the planarized surfaces of the semiconductor layer 134, the semiconductor layer 120, and the alignment mark 138, such as shown in FIG. 18. In an embodiment, the buffer semiconductor layer 150 includes silicon, such as amorphous silicon. In some embodiments, the thickness of the buffer semiconductor layer 150 can range from about 1 nm to about 10 nm and can be epitaxially grown. The operation 40 may further clean various surfaces of the device 100. For example, the operation 40 may perform SC1 (Standard Clean 1) cleaning to trim the buffer semiconductor layer 150, apply diluted HF solution to the front and backside of the wafer as well as the edges of the wafer (bevel cleaning), and so on.

Figure 19:
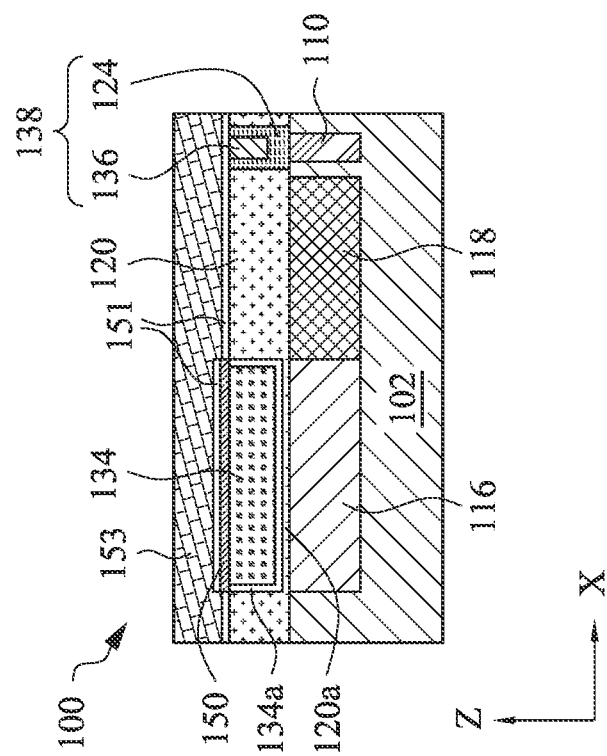

At operation 42, the method 10 (FIG. 1C) forms hard mask layers 151 and 153 on the device 100, such as shown in FIG. 19. In an embodiment, the hard mask layer 151 includes an oxide, such as silicon oxide ($SiO_2$), and the hard mask layer 153 includes a nitride, such as silicon nitride ($Si_3N_4$). In an embodiment such as depicted in FIG. 19, the hard mask layer 151 has a step profile where it is higher on the semiconductor layer 134 than on the semiconductor layer 120.

Figure 20:
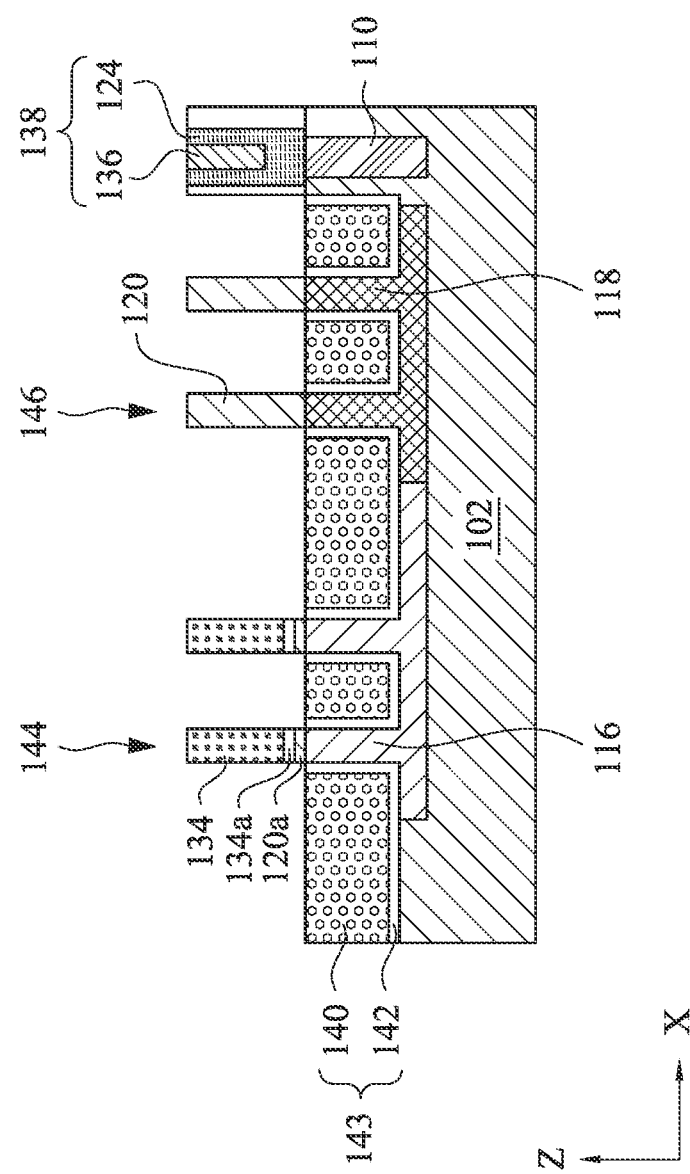
Figure 21:
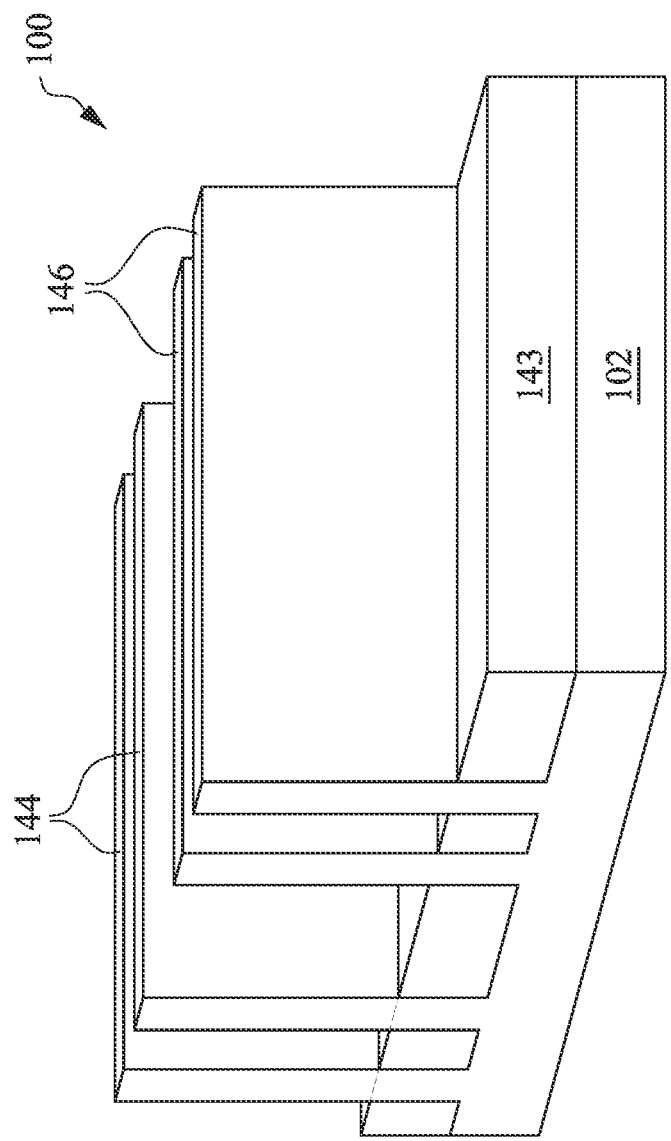
FIGS. 21 and 22 illustrate perspective views of a portion of a semiconductor device, according to some embodiments.

At operation 44, the method 10 (FIG. 1C) forms semiconductor fins 144 in the pFET regions and semiconductor fins 146 in the nFET regions, such as shown in FIGS. 20 and 21. FIG. 21 shows a perspective view of the device 100, in portion, at this fabrication stage. The operation 44 may involve a variety of processes. For example, the operation 44 may form an etch mask over the hard mask layer 153. The etch mask may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the pad silicon nitride layer and patterned using a photolithography process. Spacers are formed alongside the patterned sacrificial layer using a self-aligned process. The sacrificial layer is then removed, and the remaining spacers, or mandrels, may then be used as the etch mask for patterning the fins 144 and 146. For example, the operation 44 may etch the semiconductor layers 134, 120 and the wells 116, 118 using the etch mask as a masking element, leaving the fins 144 and 146 on the substrate 102.

After the fins 144 and 146 are formed, the operation 44 further forms an isolation structure 143 to electrically isolate the bottom portions of the fins 144 and 146. The isolation structure 143 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 143 includes a dielectric liner 142 (such as thermal oxide) on the surfaces of the fins and the surfaces of the substrate 102 and a dielectric layer 140 (such as silicon nitride and/or silicon oxide) on the dielectric liner 142. In an embodiment, the isolation structure 143 is formed by filling the trenches between fins 144 and 146 with one or more insulator materials (for example, by using a CVD process or a spin-on glass process); performing a chemical mechanical polishing (CMP) process to remove excessive insulator materials, and etching back the insulator materials to form the isolation structure 143.

As shown in FIG. 20, each fin 144 includes a portion of the semiconductor layer 134 over the seed layer 134a over the portion 120a of the semiconductor layer 120 over a portion of the N well 116; and each fin 146 includes a portion of the semiconductor layer 120 over a portion of the P well 118. The semiconductor layers 134, 134a, 120a, and 120 protrude above the isolation structure 143. Further, the alignment mark 138 is above the isolation structure 143. The top surfaces of the fins 144, 146, and the alignment mark 138 are substantially coplanar. The channel layers for p-type FinFET include the semiconductor layers 134 of the fins 144. The channel layers for n-type FinFET include the semiconductor layers 120 of the fins 146. Thus, the fins 144 and 146 are also referred to as pFET fins and nFET fins, respectively.

Figure 22:
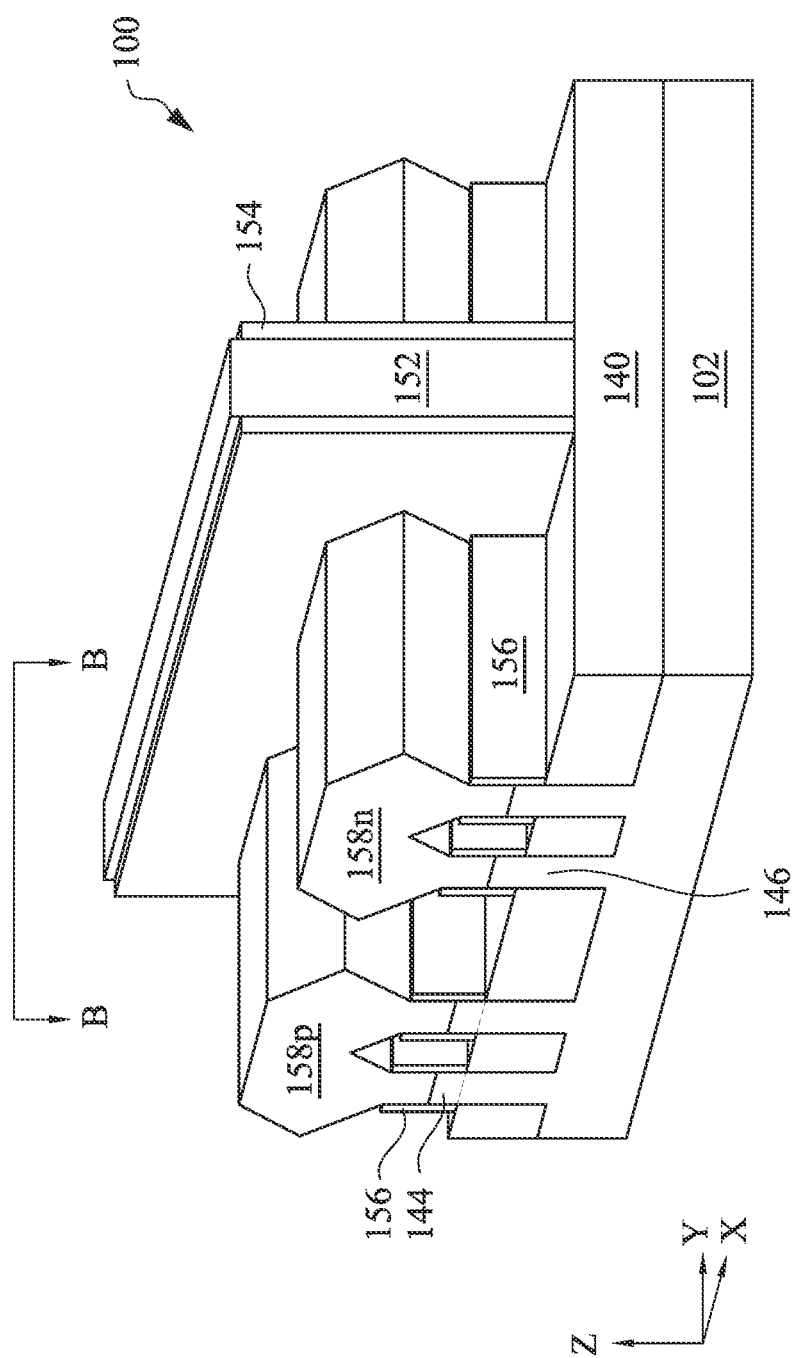
Figure 23:
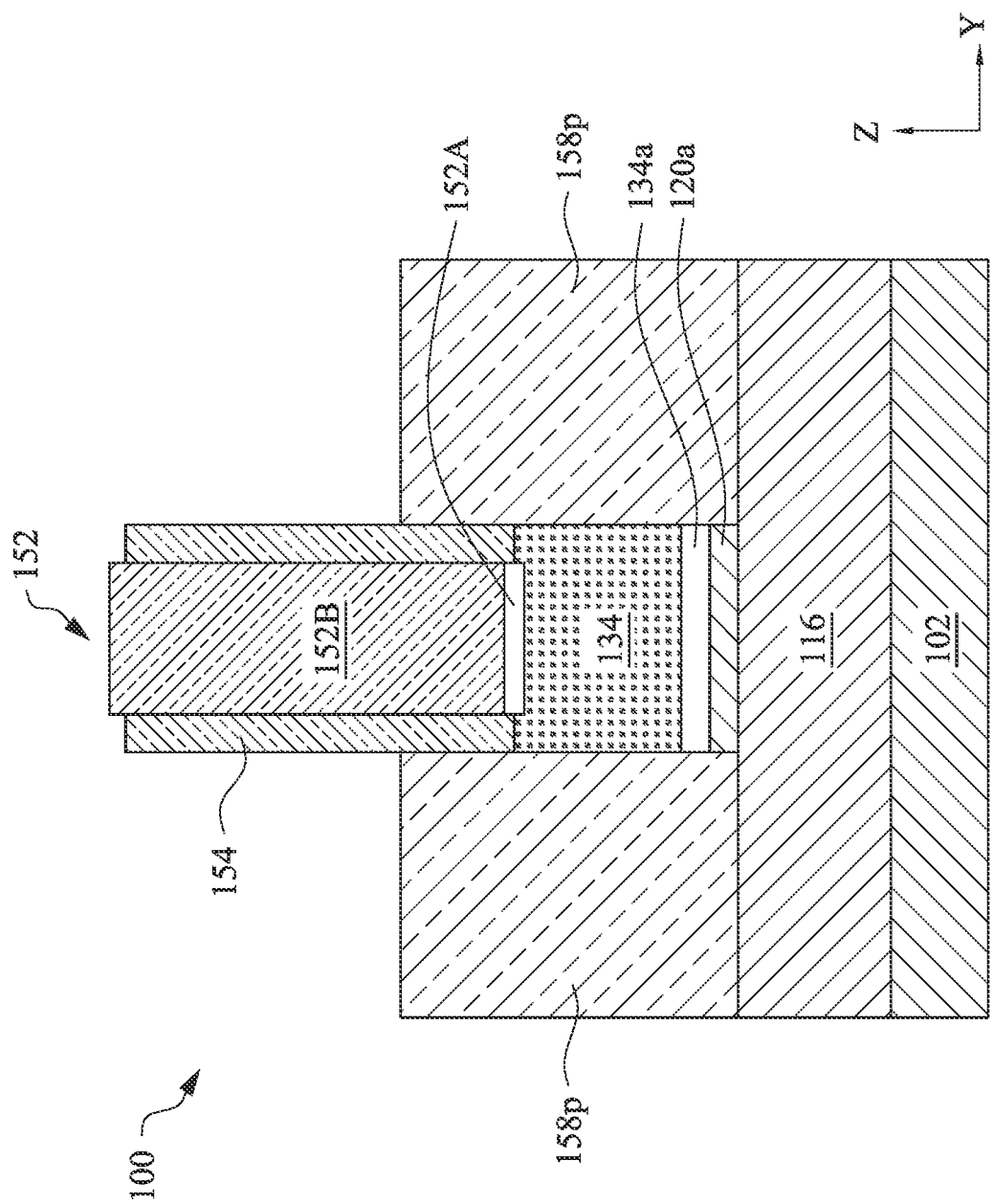

At operation 46, the method 10 (FIG. 1C) proceeds to further fabrication steps to form FinFET devices over the pFET fins 144 and nFET fins 146. For example, the operation 46 may form dummy gates over the fins 144 and 146, form source/drain regions by etching the fins 144 and 146 in the source/drain regions and epitaxially growing source/drain features over remaining portions of the fins 144 and 146 in the source/drain regions, replace the dummy gates with high-k metal gates, form inter-layer dielectric layer, form contacts to the source/drain features and high-k metal gates, form multi-level interconnect structures, and perform other fabrications. In that regard, FIG. 22 illustrates a perspective view of the device 100 after the operation 46 forms FinFET, and FIG. 23 illustrates a cross-sectional view of the device 100 along the "B-B" line in FIG. 22. As illustrated in FIGS. 22 and 23, the operation 46 forms n-type FinFET over the nFET fins 146 and p-type FinFET over the pFET fins 144, where portions of the fins 146 and 144 function as the channels for the respective FinFET. In the embodiment shown in FIGS. 22 and 23, a common high-k metal gate 152 engages the fins 146 and 144 to form a CMOS device. In alternative embodiments, the n-type FinFET and the p-type FinFET may have separate high-k metal gates.

Referring to FIGS. 22 and 23, in this embodiment, the device 100 includes a high-k metal gate 152, gate spacers 154 on sidewalls of the high-k metal gate 152, fin sidewall spacers 156, n-type source/drain features 158n over a remaining portion of the fin 146 (after a source/drain trench etching process), and p-type source/drain features 158p over a remaining portion of the fin 144 (after a source/drain trench etching process). The device 100 may include various other elements not shown in FIGS. 22 and 23. Referring to FIG. 23, in the p-type FinFET, the high-k metal gate 152 is disposed over the top portion 134 of the pFET fin 144 which provides high charge carrier mobility. The top portion 134 of the pFET fin 144 connects the two p-type source/drain features 158p and functions as the transistor channel.

Because the top portion 134 uses a high-mobility semiconductor material such as SiGe, the performance of the p-type FinFET is improved. In the present embodiment, the top portion 134 of the pFET fins 144 is partially etched in the source/drain regions and the source/drain features 158p are disposed directly on remaining portions of the top portion 134 in the source/drain region. In an alternative embodiment, the top portion 134 of the pFET fins 144 is fully etched in the source/drain regions and the source/drain features 158p are disposed directly on the bottom portion 120a or 116 in the source/drain region.

The source/drain features 158n and 158p may be formed by any suitable epitaxy process, such as vapor phase epitaxy, molecular beam epitaxy, other suitable epitaxial growth processes, or combinations thereof. In some embodiments, the source/drain features 158n include silicon and can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the source/drain features 158p include silicon germanium or germanium and can be doped with boron, other p-type dopant, or combinations thereof (for example, forming Si:Ge:B epitaxial source/drain features). In some embodiments, epitaxial source/drain features 158n and 158p are doped during deposition by adding impurities to a source material of the epitaxy process (i.e., in-situ). In some embodiments, epitaxial source/drain features 158n and 158p are doped by an ion implantation process subsequent to a deposition process. In some embodiments, annealing processes (e.g., rapid thermal annealing (RTA) and/or laser annealing) are performed to activate dopants in the epitaxial source/drain features 158n and 158p. In some embodiments, epitaxial source/drain features 158n and 158p are formed in separate processing sequences that include, for example, masking pFET regions when forming epitaxial source/drain features 158n in nFET regions and masking nFET regions when forming epitaxial source/drain features 158p in pFET regions.

In an embodiment, the high-k metal gate 152 includes a high-k gate dielectric layer 152A and a gate electrode layer 152B. The gate electrode layer 152B may include a work function layer and a bulk metal layer. The high-k metal gate 152 may include additional layers such as a dielectric interfacial layer between the top portion 134 and the high-k gate dielectric layer 152A. In various embodiments, the dielectric interfacial layer may include a dielectric material such as silicon oxide, silicon oxynitride, or silicon germanium oxide, and may be formed by chemical oxidation, thermal oxidation, atomic layer deposition (ALD), chemical vapor deposition (CVD), and/or other suitable methods. The dielectric interfacial layer may include different dielectric materials for n-type FinFET and for p-type FinFET. For example, the dielectric interfacial layer may include silicon oxide for n-type FinFET and silicon germanium oxide for p-type FinFET. The high-k gate dielectric layer 152A may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function layer (part of the gate electrode layer 152B) may include a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), aluminum (Al), or combinations thereof; and may be deposited by CVD, PVD, and/or other suitable process. The bulk metal layer (part of the gate electrode layer 152B) may include a metal such as aluminum (Al), tungsten (W), cobalt (Co), copper (Cu), and/or other suitable materials; and may be deposited using plating, CVD, PVD, or other suitable processes.

Each of the fin sidewall spacers 156 and the gate spacers 154 may be a single layer or multi-layer structure. In some embodiments, each of the spacers 156 and 154 includes a dielectric material, such as silicon oxide ($SiO_2$), silicon nitride ($Si_3N_4$), silicon oxynitride (SiON), other dielectric material, or combination thereof. In an example, the spacers 156 and 154 are formed by depositing a first dielectric layer (e.g., a $SiO_2$ layer having a substantially uniform thickness) as an liner layer over the device 100, and a second dielectric layer (e.g., a $Si_3N_4$ layer) as a main D-shaped spacer over the first dielectric layer, and then, anisotropically etching to remove portions of the dielectric layers to form the spacers 156 and 154. Additionally, the fin sidewall spacers 156 may be partially removed during the etching process that forms recesses into the fins 146 and 144 prior to growing the source/drain features 158n and 158p. In some embodiments, the fin sidewall spacers 156 may be completely removed by such etching process.

Although not intended to be limiting, embodiments of the present disclosure provide one or more of the following advantages. For example, embodiments of the present disclosure form pFET fins and nFET fins over the same substrate where the pFET fins include a channel semiconductor material that has higher hole mobility than the channel semiconductor material in the nFET fins. This improves the performance of p-type FinFET formed from the pFET fins. Further, growth of the channel semiconductor material for the pFET fins uses an isothermal process which not only reduces fabrication time but also improves the quality of the channel semiconductor material. Embodiments of the present disclosure can be readily integrated into existing semiconductor manufacturing processes.

In one example aspect, the present disclosure is directed to a method. The method includes forming an N well and a P well in a substrate; depositing a first layer having silicon over the N well and the P well; depositing a first dielectric layer over the first layer; forming a resist pattern over the first dielectric layer, the resist pattern providing an opening directly above the N well; etching the first dielectric layer and the first layer through the opening, leaving a first portion of the first layer over the N well; removing the resist pattern; and epitaxially growing a second layer having silicon germanium (SiGe) over the first portion of the first layer. The epitaxially growing the second layer includes steps of (a) performing a baking process, (b) depositing a silicon seed layer, and (c) depositing a SiGe layer over the silicon seed layer, wherein the steps (a), (b), and (c) are performed under about a same temperature.

In an embodiment of the method, the steps (a), (b), and (c) are performed under a temperature in a range of about 650° C. to 750° C. In another embodiment, the baking process is performed in $H_2$ ambient.

In an embodiment, the method further includes depositing a second dielectric layer over the first dielectric layer and over the SiGe layer; performing a first chemical mechanical polishing (CMP) process to the second dielectric layer and the first dielectric layer; and performing a second CMP process to the SiGe layer and the first layer. In a further embodiment, the method includes patterning the first layer and the P well to form first fins; patterning the SiGe layer and the N well to form second fins; and forming an isolation feature to isolate bottom portions of the first fins and the second fins. In a further embodiment, the method includes forming n-type FinFET over the first fins and above the isolation feature; and forming p-type FinFET over the second fins and above the isolation feature.

In an embodiment, before the depositing of the first layer, the method further includes forming a portion of an alignment mark into the substrate. In another embodiment, before the depositing of the first dielectric layer, the method further includes forming an alignment trench into the first layer.

In an embodiment of the method, the second layer is epitaxially grown such that its top surface is higher than a top surface of the first layer and is lower than a top surface of the first dielectric layer. In another embodiment, temperatures under which the steps (a), (b), and (c) are performed vary less than +/−10° C.

In another example aspect, the present disclosure is directed to a method. The method includes providing a substrate; depositing a silicon layer over the substrate; etching an alignment trench into the silicon layer; depositing a first oxide layer over the silicon layer and in the alignment trench; forming an etch mask over the first oxide layer, wherein the etch mask covers the alignment trench and has an opening directly above a first portion of the silicon layer; etching the first oxide layer and the first portion of the silicon layer through the opening, thereby forming a first trench; removing the etch mask; and epitaxially growing a second layer having silicon germanium (SiGe) in the first trench, wherein the epitaxially growing the second layer includes steps of (a) performing a baking process, (b) depositing a silicon seed layer, and (c) depositing a SiGe layer on the silicon seed layer, wherein the steps (a), (b), and (c) are performed under about a same temperature.

In an embodiment, the method further includes depositing a second oxide layer over the first oxide layer and over the SiGe layer; performing a first chemical mechanical polishing (CMP) process to the first and the second oxide layers; and performing a second CMP process to the SiGe layer.

In an embodiment of the method, the steps (a), (b), and (c) are performed under a temperature in a range of about 650° C. to 750° C. In another embodiment, the second layer is epitaxially grown such that its top surface is higher than a top surface of the silicon layer and is about even with or lower than a top surface of the first oxide layer.

In some embodiment, the baking process is performed in H$_2$ ambient. In some embodiment, the baking process is performed in ambient having N$_2$, Ar, He, or a combination thereof. In an embodiment, the etching of the first portion of the silicon layer through the opening leaves a layer of the first portion of the silicon layer in the first trench.

In yet another example aspect, the present disclosure is directed to a semiconductor structure that includes a substrate, a first fin extending from the substrate, and an alignment mark over the substrate and having one or more dielectric layers. The first fin includes a bottom portion and an upper portion over the bottom portion, the upper portion and the bottom portion include different materials, and the upper portion includes silicon germanium. A top surface of the first fin is substantially coplanar with a top surface of the alignment mark.

In an embodiment, the alignment mark partially extends into the substrate. In another embodiment, the alignment mark includes a first dielectric layer and a second dielectric layer over the first dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an N well and a P well in a substrate;
   depositing a first layer having silicon over the N well and the P well;
   depositing a first dielectric layer over the first layer;
   forming a resist pattern over the first dielectric layer, the resist pattern providing an opening directly above the N well;
   etching the first dielectric layer and the first layer through the opening, leaving a first portion of the first layer over the N well;
   removing the resist pattern;
   epitaxially growing a second layer having silicon germanium (SiGe) over the first portion of the first layer, wherein the epitaxially growing the second layer includes steps of (a) performing a baking process, (b) depositing a silicon seed layer, and (c) depositing a SiGe layer over the silicon seed layer, wherein the steps (a), (b), and (c) are performed in an isothermal process;
   depositing a second dielectric layer over the first dielectric layer and over the SiGe layer;
   performing a first chemical mechanical polishing (CMP) process to the second dielectric layer and the first dielectric layer; and
   performing a second CMP process to the SiGe layer and the first layer.

2. The method of claim 1, wherein the steps (a), (b), and (c) are performed at a temperature in a range of about 650° C. to 750° C.

3. The method of claim 1, wherein the baking process is performed in H$_2$ ambient.

4. The method of claim 1, further comprising:
   patterning the first layer and the P well to form first fins;
   patterning the SiGe layer and the N well to form second fins; and
   forming an isolation feature to isolate bottom portions of the first fins and the second fins.

5. The method of claim 4, further comprising:
   forming n-type FinFET over the first fins and above the isolation feature; and
   forming p-type FinFET over the second fins and above the isolation feature.

6. The method of claim 1, before the depositing of the first layer, further comprising:
   forming a portion of an alignment mark into the substrate.

7. The method of claim 1, before the depositing of the first dielectric layer, further comprising:
   forming an alignment trench into the first layer.

8. The method of claim 1, wherein the second layer is epitaxially grown such that its topmost surface is higher than a top surface of the first layer and is lower than a top surface of the first dielectric layer.

9. The method of claim 1, wherein temperatures at which the steps (a), (b), and (c) are performed vary less than +/−10° C.

10. The method of claim 1, further comprising:
before the forming of the N well and P well, forming an alignment mark in the substrate, wherein a top surface of the N well and P well is coplanar with a top surface of the alignment mark.

11. A method comprising:
providing a substrate;
depositing a silicon layer over the substrate;
etching an alignment trench into the silicon layer;
depositing a first oxide layer over the silicon layer and in the alignment trench, wherein the first oxide layer partially fills the alignment trench and leaves a remaining portion of the alignment trench unfilled;
forming an etch mask over the first oxide layer, wherein the etch mask fully fills the remaining portion of the alignment trench and has an opening directly above a first portion of the silicon layer;
etching the first oxide layer and the first portion of the silicon layer through the opening, thereby forming a first trench;
removing the etch mask; and
epitaxially growing a second layer having silicon germanium (SiGe) in the first trench, wherein the epitaxially growing the second layer includes steps of (a) performing a baking process, (b) depositing a silicon seed layer, and (c) depositing a SiGe layer on the silicon seed layer, wherein the steps (a), (b), and (c) are performed in an isothermal process.

12. The method of claim 11, further comprising:
depositing a second oxide layer over the first oxide layer and over the SiGe layer;
performing a first chemical mechanical polishing (CMP) process to the first and the second oxide layers; and
performing a second CMP process to the SiGe layer.

13. The method of claim 11, wherein the steps (a), (b), and (c) are performed at a temperature in a range of about 650° C. to 750° C.

14. The method of claim 11, wherein the second layer is epitaxially grown such that its topmost surface is higher than a top surface of the silicon layer and is about even with or lower than a top surface of the first oxide layer.

15. The method of claim 11, wherein the baking process is performed in $H_2$ ambient.

16. The method of claim 11, wherein the baking process is performed in ambient having $N_2$, Ar, He, or a combination thereof.

17. The method of claim 11, wherein the etching of the first portion of the silicon layer through the opening leaves a layer of the first portion of the silicon layer in the first trench.

18. A method comprising:
providing a substrate;
forming an alignment mark in the substrate;
forming an N well and a P well in the substrate based on a distance from the alignment mark:
forming a first layer having silicon over the N well, the P well, and the alignment mark;
etching the first layer to form an alignment trench exposing the alignment mark;
forming a first dielectric layer over the first layer, the first dielectric layer filling the alignment trench;
etching the first dielectric layer and the first layer above the N well, leaving a first portion of the first layer over the N well and a second portion of the first layer over the P well, wherein the first portion of the first layer is thinner than the second portion of the first layer;
while the first dielectric layer covering the second portion of the first layer, epitaxially growing a second layer having silicon germanium (SiGe) over the first portion of the first layer, wherein the epitaxially growing the second layer includes steps of (a) performing a baking process, (b) depositing a silicon seed layer, and (c) depositing a SiGe layer over the silicon seed layer, wherein the steps (a), (b), and (c) are performed in an isothermal process;
patterning the second portion of the first layer and the P well to form first fins; and
patterning the second layer, the first portion of the first layer, and the N well to form second fins.

19. The method of claim 18, wherein the second layer is epitaxially grown such that its topmost surface is higher than a top surface of the second portion of the first layer and is lower than a top surface of the first dielectric layer.

20. The method of claim 18, before the patterning of the second portion of the first layer and the P well and before the patterning of the second layer, the first portion of the first layer, and the N well, further comprising:
depositing a second dielectric layer over the first dielectric layer and over the second layer;
performing a first chemical mechanical polishing (CMP) process to the second dielectric layer and the first dielectric layer; and
performing a second CMP process to the second layer and the first layer.

\* \* \* \* \*